(12) United States Patent
Lagoguez et al.

(10) Patent No.: US 6,603,350 B2
(45) Date of Patent: Aug. 5, 2003

(54) REGULATOR DEVICE FOR CONTROLLING THE POWER OF A TRANSMITTER

(75) Inventors: Bruno Lagoguez, Claix (FR); Jean Claude Brigaud, Montreuil sur Epte (FR); Mikaël Pouliquen, Paris (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/128,567

(22) Filed: Apr. 24, 2002

(65) Prior Publication Data

US 2002/0171482 A1 Nov. 21, 2002

(30) Foreign Application Priority Data

May 7, 2001 (FR) .............................. 01 06072

(51) Int. Cl.[7] .................................................. H03G 3/20
(52) U.S. Cl. ...................................... 330/129; 330/141
(58) Field of Search ................................. 330/129, 141, 330/281, 279

(56) References Cited

U.S. PATENT DOCUMENTS 5,150,075 A    9/1992  Hietala et al.
5,334,945 A  * 8/1994  Yokoya et al. ............... 330/129
5,642,075 A  * 6/1997  Bell ............................ 330/129
5,896,064 A  * 4/1999  Kaku .......................... 330/129
6,307,429 B1 * 10/2001 Olgaard ...................... 330/129
6,477,358 B1 * 11/2002 Mader et al. ............... 330/129

FOREIGN PATENT DOCUMENTS

EP           0 434 294 A2   6/1991

* cited by examiner

*Primary Examiner*—Robert Pascal
*Assistant Examiner*—Khanh Van Nguyen
(74) *Attorney, Agent, or Firm*—Sughrue Mion, PLLC

(57) ABSTRACT

The invention relates to a device for transmitting radiofrequency signals using a power amplifier. The power amplifier is connected to a power regulation loop for regulating its gain in such a manner as to bring the output power level to a desired nominal level. The regulation loop acts on the bias voltage as a function of the output from the power amplifier. According to the invention, the device further comprises adjustment means such as an integrating RC circuit for supplying an additional voltage to the regulation loop in such a manner that the input signal to the loop is more responsive and less dependent on the active components of the power amplifier. The invention is particularly applicable in the field of mobile transmission.

5 Claims, 1 Drawing Sheet

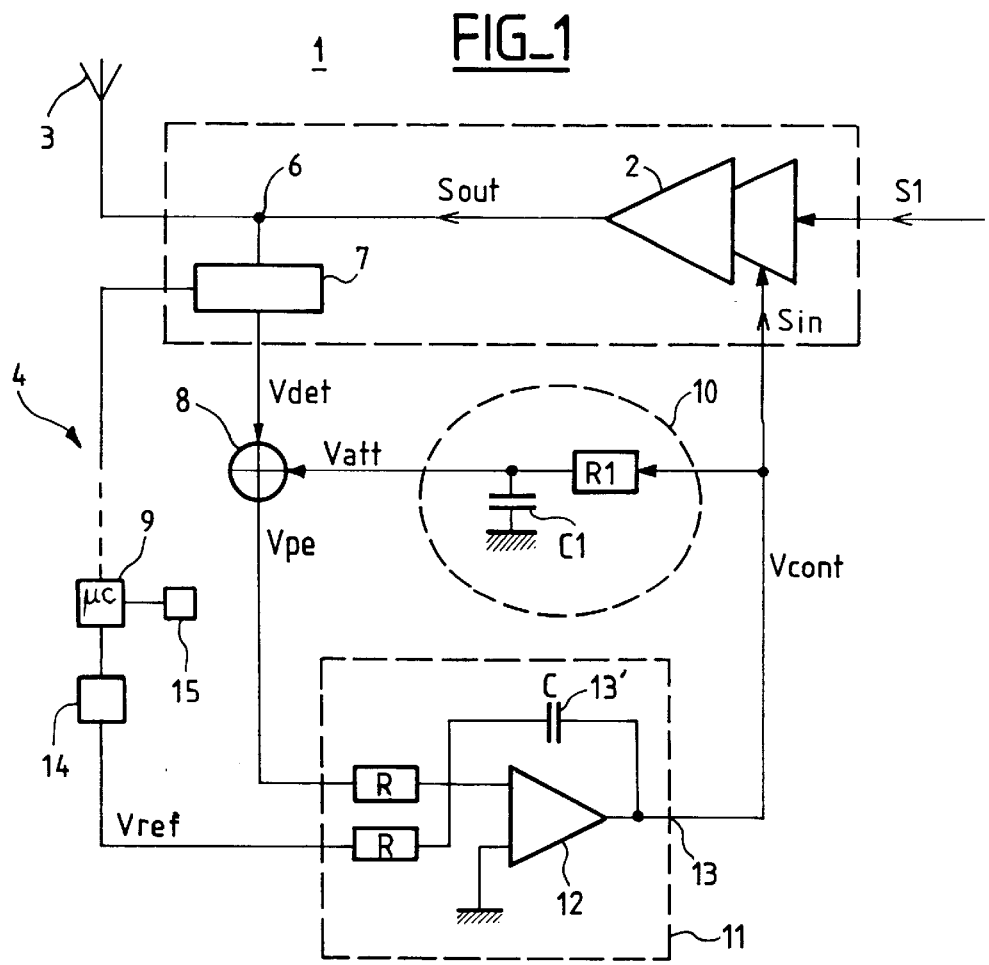
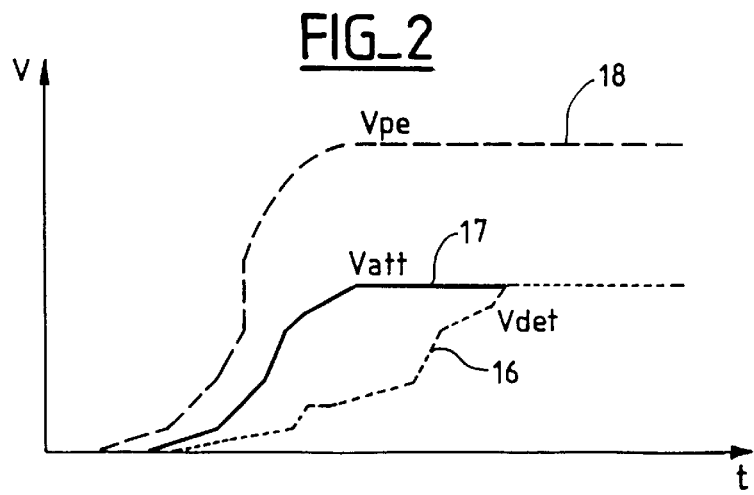

REGULATOR DEVICE FOR CONTROLLING THE POWER OF A TRANSMITTER

BACKGROUND OF THE INVENTION

The present invention relates to the field of transmitting radiofrequency signals, and it relates more particularly to a device for transmitting radiofrequency signals, the device comprising power amplifier means for amplifying the power of a radiofrequency signal received at an input of said power amplifier means, and gain control means for controlling the gain of said power amplifier means to regulate said gain in such a manner that the power of the output signal from said power amplifier means tends towards a desired nominal value.

In a telecommunications system connecting a mobile terminal to a base station, it is necessary to guarantee a minimum quality of service. For example, when transmitting digital signals, this condition requires that the binary error rate should always be less than some specified rate. To satisfy this condition on reception, it is ensured that the received signal-to-noise ratio exceeds a predetermined value at all times.

The problem which the invention seeks to solve is that of allocating a power resource to each call from the terminal to the base station which is dedicated thereto, such that said power is just sufficient for the signal-to-noise ratio to satisfy specifications. This ensures that calls have a required quality of service guaranteeing a binary error rate below a predetermined limit while avoiding excessive power consumption. The transmitted power needs to be only just sufficient because of the limited amount of power available in the terminal.

To enable the power of the signal for transmission to be raised, the mobile terminal is provided with a power amplifier. During a call, this power amplifier is used to transmit at a power level that is sufficient to enable the corresponding base station to receive properly, given the specifications in force. For example, when said base station is at a distance from the terminal such that it receives little or no more call information from the terminal, the station sends a message to the terminal to transmit at some higher level of power as determined by the station.

A correspondence table, e.g. recorded in a memory of the terminal, establishes a correspondence between this power level to be transmitted and a predetermined value. The signal to be transmitted is input to the power amplifier, and a loop then monitors the signal output by the power amplifier in order to compare it with said predetermined value. Until this value is reached, the comparator acts on the power amplifier to cause it to increase its output power.

Unfortunately, the way in which a power amplifier increases its output power varies from one amplifier to another depending on the particular components constituting it, on the drift to which it might have been subject, . . . .

Nevertheless, this state of affairs must comply with timing characteristics defined in specifications and stipulating limits within which the rise in amplifier power must lie. Thus, if power rises too slowly, then information can be lost, whereas if power rises too quickly then that will occupy a large amount of spectrum which will be detrimental to the calls of other terminals.

Consequently, from the above, it can be seen that in prior art terminals, the length of time it takes to raise the power from a power amplifier is not only undeterminable, but it can also be too long to guarantee that the required quality of service is complied with.

OBJECTS AND SUMMARY OF THE INVENTION

An object of the present invention is to remedy the problem as posed above at the terminal, and it seeks to reach the desired power level quickly following a stimulus of the input signal at the determined input of the power amplifier.

To this end, the invention provides a device for transmitting radiofrequency signals, the device comprising power amplifier means for amplifying a power of the radiofrequency signal received at an input of said power amplifier means, and gain control means for controlling the gain of said power amplifier means to regulate said gain in such a manner that the power of the output signal from said power amplifier means tends towards a desired nominal value, said gain control means operating on a monitoring signal representative of a measurement signal giving the output power from said power amplifier means, in order to deliver a gain control signal for controlling variation in the gain of the power amplifier means, wherein, in addition to the power amplifier means, said device further comprises adjustment means that are responsive to said gain control signal to deliver an additional adjustment signal to the gain control signal in such a manner that the monitoring signal, which is also representative of the adjustment signal, is suitable for causing said gain control means to respond more quickly.

Thus, the device of the invention with adjustment means other than the prior art regulation loop and reacting more quickly to the signal input to the power amplifier makes it possible to reach a desired power level for transmission more quickly. The transfer function of the power amplifier is modified for this purpose.

In an embodiment, the adjustment means comprise only passive components. Thus, the responses to an input signal stimulus can drift only very little, whereas said usual control means have active elements whose responses are liable to drift.

In an embodiment, the adjustment means comprise a resistor bridge.

In an embodiment, the adjustment means comprise an integrating RC circuit.

In an embodiment, the device of the invention is integrated in a digital appliance belonging to the group {mobile telephone; digital personal assistant; portable computer}.

BRIEF DESCRIPTION OF THE DRAWING

The invention will be better understood on reading the following description and on examining the accompanying figures. The figures are given by way of non-limiting indication. In the figures:

FIG. 1 shows an embodiment of a device of the invention; and

FIG. 2 plots curves showing the voltages across the terminals of the adjustment means and the terminals of the amplifier, with and without the adjustment means.

MORE DETAILED DESCRIPTION

The device 1 in the embodiment of the invention shown in FIG. 1 is illustrated so as to emphasize the various functional components of the invention.

The power amplifier 2 receives an input signal Sin that is to be amplified. This signal comes from processor blocks upstream. For example, in the context of a mobile telephone, speech in the form of soundwaves is converted into an analog signal, and then into a digital signal. This is subjected to modulation and then to frequency transposition so as to put the baseband signal onto a higher frequency. As mentioned above, this signal needs to be subjected to power amplification in such a manner as to be capable of being received by the base station (not shown) that is in communication with the terminal.

The output signal Sout from the amplifier is then applied to an antenna 3 for communication with the base station.

The signal Sout is also applied to a loop 4 (on one of its branches) via an output 6 of the amplifier delivering the signal Sout.

The loop 4 is also connected to an input 5 of the amplifier, which input receives the bias voltage control of the amplifier.

The signal Sout entering the loop via the point 6 is applied to a detector circuit 7 for detecting the power output by the amplifier 2. The detector circuit is connected firstly to the output of a summing circuit 8 and secondly to a microcontroller 9 whose function is explained below. Another input of the summing circuit receives a signal coming from the output of an adjustment circuit 10, which comprises an attenuator circuit R1C1.

An output from the summing circuit summing the voltages at the input terminals of the summing circuit is connected to a first input of a conventional comparator block 11. In conventional manner, this block comprises two resistors R, one of which is connected to said input and to one of the input terminals of an operational amplifier 12, while the other resistor R is connected to a capacitor 13'. The other end of the capacitor is connected to the output from the operational amplifier 12. The other input terminal of the amplifier is connected to ground. The other end of the second resistor is connected to a second input terminal of the block 11. This second input terminal is connected to an output of a digital-to-analog converter 14 whose input is connected to an output of the microcontroller 9. The microcontroller is also connected to a memory 15.

The output from the amplifier 12 is connected to the output 13 of the comparator block 11. This output is connected firstly to the input of the circuit 10 and secondly to the bias voltage control input 5 of the power amplifier 2.

The device 1 of the invention operates as follows:

When the terminal containing the device of the invention is in transmission mode, a signal Sin to be amplified is provided at the input of the power amplifier 2. The power amplifier then amplifies this signal in bursts (in particular to avoid overheating). The standard specifies bottom and top ranges for variation in said power over time, thus forming the characteristics of the standard.

If the terminal is to transmit at 33 dBm, for example, the detection circuit 7 monitors the signal Sout and supplies it to the microcontroller 9. The memory 15 also contains a correspondence table matching a plurality of transmission power levels with a respective plurality of digital values. Thus, in this case, the 33 dBm power to be transmitted corresponds to a predetermined digital value. This value is converted into a reference analog signal by the converter 14 which applies a reference voltage Vref to one of the input terminals of the comparator block 11.

So long as the voltage Vpe at the other input terminal of the comparator block 11 is less than Vref, the block 11 delivers an increasing positive voltage Vcont on its output 13 so as to act on the bias voltage of the power amplifier 2 and on the voltage present at the terminals of the block 10. Given the response times of the block 10 and of the power amplifier 2, and as described below, the block 10 responds initially to the reference Vcont (the block 10 is faster and Vatt is the first to vary), after which the amplifier 2 responds to the reference (it responds more slowly, and consequently Vdet varies subsequently). The response Vpe therefore varies initially with a response time under the effect of Vatt and subsequently under the cumulative effect of Vdet+Vatt, until it reaches Vref.

As explained above, in the prior art, only the comparator block 11 is arranged in the loop to adjust on the desired power level. However, in that prior art configuration, the block 11 is subjected solely to control from the output signal Sout from the power amplifier. In the light of the introduction of the present patent application, and given that the power amplifier includes active components whose frequency response and/or whose response over time can vary, it follows that if the response of the power amplifier is not fast enough, then the output signal will not control the block 11 fast enough.

In the invention, this is solved by the R1C1 cell which has a transfer function with a time constant:

$$1/(1+jR1C1\omega)$$

adapted to inject an additional voltage to the summing circuit 8 so that the voltage Vpe is amplified more quickly and independently of the active components in the amplifier 2. In order to be effective, the impulse response time of the filter cell constituted by R1 and C1 must be less than the response time of the power amplifier.

As a result, the voltage Vcont output by the comparator 11 is also amplified relative to a voltage Vdet without the voltage Vatt, which influences the power amplifier so as to output a signal Sout of increased power which is amplified to a greater extent than it would have been if the cell R1C1 did not exist.

FIG. 2 shows the advantage of such a circuit. This figure shows how the three voltages Vdet, Vatt, and Vpe vary during the initial stages of transmission of an input signal by the power amplifier until steady conditions are reached. There can thus be seen a first curve 16 showing how the voltage Vdet as detected at the output from the power amplifier varies. A second curve 17 shows how the voltage Vatt from the cell R1C1 varies, and this is shown as increasing with a faster reaction in time than the curve 16. As a result, the voltage Vpe as represented by curve 18 which is the sum of the other two voltages increases much more quickly than it would without Vatt. This is due to the addition of the cell R1C1 and can be understood from the new overall transfer function which can be written as follows:

$$Vpe = Vdet + Vatt = \left(Hdet \cdot Hpa + \frac{1}{(1+jR1C1\omega)}\right) \cdot Vcont$$

Naturally, the invention is not limited to the embodiments described above. Thus, instead of or in addition to the integrating circuit R1C1, it is possible to use a resistor bridge. The device 1 is particularly adapted for being integrated in a digital appliance belonging to the group {mobile telephone; digital personal assistant; portable computer}.

What is claimed is:

1. A device for transmitting radiofrequency signals, the device comprising power amplifier means for amplifying the power of a radiofrequency signal received at an input of said power amplifier means, and gain control means for controlling the gain of said power amplifier means to regulate said gain in such a manner that the power of the output signal from said power amplifier means tends towards a desired nominal value, said gain control means operating on a monitoring signal representative of a measurement signal giving the output power from said power amplifier means, in order to deliver a gain control signal for controlling variation in the gain of the power amplifier means, wherein, in addition to the power amplifier means, said device further comprises adjustment means that are responsive to said gain control signal to deliver an additional adjustment signal to the gain control signal in such a manner that the monitoring signal, which is also representative of the adjustment signal, is suitable for causing said gain control means to respond more quickly.

2. A device according to claim 1, wherein the adjustment means comprise only passive components.

3. A device according to claim 1, wherein the adjustment means comprise a resistor bridge.

4. A device according to claim 1, wherein the adjustment means comprise an integrating RC circuit.

5. A device according to claim 1, the device being integrated in a digital appliance belonging to the group {mobile telephone; digital personal assistant; portable computer}.

* * * * *